(12) United States Patent
Wen et al.

(10) Patent No.: US 9,000,797 B2
(45) Date of Patent: Apr. 7, 2015

(54) TFT-LCD ARRAY SUBSTRATE HAVING A CONNECTING DEVICE FOR TESTING TWICE AND TEST METHOD FOR THE SAME

(71) Applicant: Shenzhen China Star Optoelectronics Technology Co., Ltd., Shenzhen, Guangdong (CN)

(72) Inventors: Songxian Wen, Shenzhen (CN);
Jungmao Tsai, Shenzhen (CN);
Shiue-shih Liao, Shenzhen (CN);
Yizhuang Zhuang, Shenzhen (CN);
Mingfeng Deng, Shenzhen (CN)

(73) Assignee: Shenzhen China Star Optoelectronics Technology Co., Ltd., Shenzhen, Guangdong (CN)

( * ) Notice: Subject to any disclaimer, the term of this patent is extended or adjusted under 35 U.S.C. 154(b) by 282 days.

(21) Appl. No.: 13/697,360

(22) PCT Filed: Sep. 26, 2012

(86) PCT No.: PCT/CN2012/082030
§ 371 (c)(1),
(2) Date: Nov. 11, 2012

(87) PCT Pub. No.: WO2014/040315
PCT Pub. Date: Mar. 20, 2014

(65) Prior Publication Data
US 2014/0070835 A1    Mar. 13, 2014

(51) Int. Cl.
*G01R 31/26* (2014.01)
*G01R 31/28* (2006.01)
*H01L 23/58* (2006.01)
*G09G 3/36* (2006.01)

(52) U.S. Cl.
CPC ............ *G01R 31/2851* (2013.01); *H01L 23/58* (2013.01); *H01L 2924/0002* (2013.01); *G09G 3/36* (2013.01); *G09G 2300/0426* (2013.01); *G09G 3/3648* (2013.01)

(58) Field of Classification Search
None
See application file for complete search history.

(56) References Cited

U.S. PATENT DOCUMENTS

| | | | | |
|---|---|---|---|---|
| 2008/0074137 | A1* | 3/2008 | Kim et al. | 324/770 |
| 2008/0204618 | A1* | 8/2008 | Jung et al. | 349/40 |
| 2013/0242215 | A1* | 9/2013 | Chang | 349/41 |
| 2013/0265072 | A1* | 10/2013 | Kim et al. | 324/754.01 |

* cited by examiner

*Primary Examiner* — Minh N Tang
(74) *Attorney, Agent, or Firm* — Andrew C. Cheng (57) ABSTRACT

A TFT-LCD array substrate includes a display area, a peripheral area located at a periphery of the display area, and a connecting device. Wherein, the display area includes a plurality of data lines and gate lines. The peripheral area provides with a first test short bar provided with a plurality of data test lines for transmitting a test signal for the data lines, and a second test short bar provided with a gate test line for transmitting a test signal for the gate lines. The connecting device includes a first connection layer and a second connection layer. The connecting device is disposed at a connection location between one of the data test lines and one of the data lines, or between the gate test line and one of the gate lines. A test method for testing the TFT-LCD array substrate is also provided.

8 Claims, 5 Drawing Sheets

TFT-LCD ARRAY SUBSTRATE HAVING A CONNECTING DEVICE FOR TESTING TWICE AND TEST METHOD FOR THE SAME

The claims of this application have submitted to the State Intellectual Property Office of the People's Republic of China (SIPO) on Sep. 12, 2012, Application No. 201210335918.2. The priority right based on the China application has a title of "a TFT-LCD array substrate and a test method for the same". The entire contents of the above-mentioned patent application will be incorporated in the present application through citing.

BACKGROUND OF THE INVENTION

1. Field of the Invention

The present invention relates to a test technology of a liquid crystal display (LCD) panel, and more particular to a thin film transistor liquid crystal display (TFT-LCD) array substrate and a test method for the same.

2. Description of Related Art

The TFT-LCD is the display device that fully catches up and overtakes a cathode ray tube (CRT) display device on the overall performance of the brightness, contrast, power, life, volume and weight. It has excellent performance, good characteristic for mass production, and high degree of automation so as to rapidly become mainstream products. The LCD panel of the TFT-LCD device comprises a thin-film transistor array substrate (array substrate), a color filter array substrate (CF substrate), and liquid crystals sandwiched between the two substrates. Wherein, the array substrate and the CF substrate are formed through a chemical or physical method and then exposure, developing, etching to get a required design of the array substrate. Before shipment of the LCD panel of the TFT-LCD device, in order to ensure the quality of the products, it must pass a test process for mainly checking whether the TFT structure of the LCD panel is normal.

Figure 1:
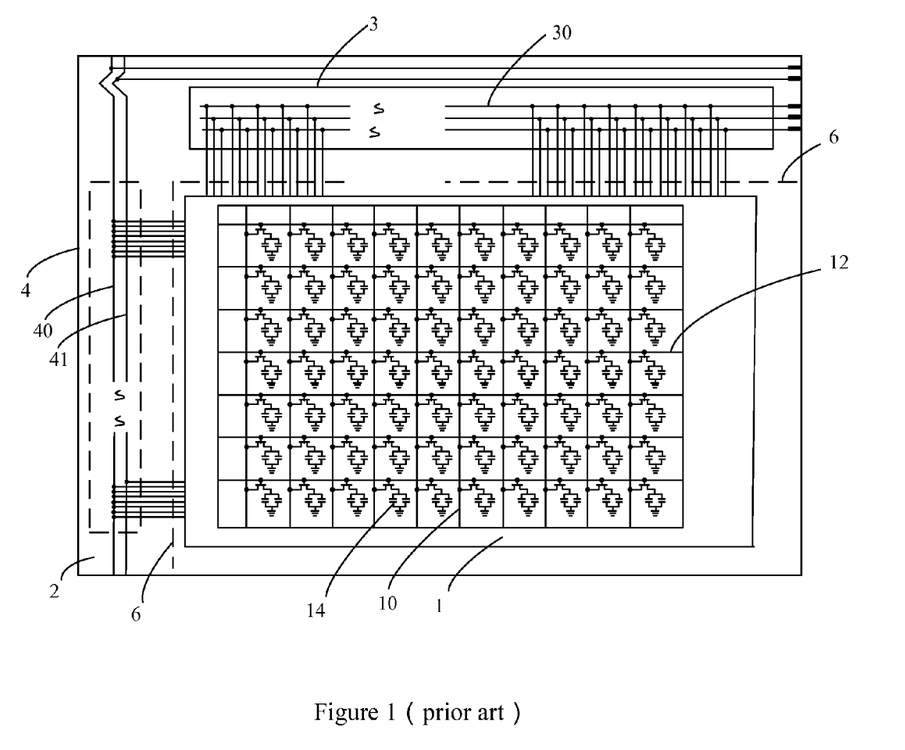
FIG. 1 is a schematic view of a typical TFT-LCD array substrate.

In the conventional test technology of the LCD panel, it uses a test short bar wiring on the panel to test. As shown in FIG. 1, it illustrates a schematic view of a typical TFT-LCD array substrate. Wherein, the LCD panel includes a display area 1 and a peripheral area 2 located at a periphery of the display area 1.

In the display area 1, it provides with a plurality of data lines 10 and a plurality of gate lines 12 mutually perpendicular. The intersection location of each of the data lines 10 and the gate lines 12 connects with a TFT unit 14, and each of the TFT units 14 includes a TFT, a liquid crystal capacitor and a storage capacitor. The source electrode of the TFT of each of the TFT unit 14 connects to one of the data line 10, and its gate electrode connects to one of the gate line 12.

In the peripheral area 2, it provides with a first test short bar. And a plurality of data test lines 30 (respectively corresponding to red/green/blue test) are disposed on the first test short bar and respectively connect to the data lines 10 in the display area 1 for transmitting a data test signal to the data lines 10. A second test short bar includes a gate test line 40 and a common electrode line 41, wherein the gate test line 40 connects to the gate lines 12 in the display area 1, and it is used to transmit a test signal to the gate lines 12; the common electrode line 41 is used to provides a common electrode for the display area of each of the TFT units 14. Wherein, the data test signal and the gate test signal may all be square wave signals, and they can light up the TFT units to execute a defect inspection.

When the above inspection is completed, the LCD panel can be cut at a position 6, to separate the peripheral area 2 and the display area 1, and then move the LCD panel with removed peripheral area 2 to the next working process (e.g. the subsequent process).

The inventors have found that in the prior art, if a product problem is found in the next step, it cannot execute a test for the LCD panel because the test short bars has been removed. And thus it is difficult to identify that the problem found at the defective products is cause by the LCD panel itself or by the subsequent process.

SUMMARY OF THE INVENTION

The technical problems to be solved by the present invention is providing a TFT-LCD array substrate and a test method for the same to be able to execute a second test for it in order to overcome the drawback of unable to execute the test again after shipment of the TFT-LCD array substrate in the prior art.

To solve the above technical problems, an embodiment of the present invention provides a TFT-LCD array substrate comprising:

a display area comprising a plurality of data lines and a plurality of gate lines;

a peripheral area located at a periphery of the display area and provided with a first test short bar provided with a plurality of data test lines for transmitting a test signal for the data lines in the display area; and a second test short bar provided with a gate test line for transmitting a test signal for the gate lines in the display area; and a connecting device comprising a first connection layer and a second layer and provided at a connection location between one of the data test lines in the first test short bar and one of the data lines in the display area, or/and provided at a connection location between the gate test line in the second test short bar and one of the gate lines in the display area.

Wherein, the connecting device comprises:

the first connection layer having two terminals, one terminal of the first connection layer connecting to one of the data test lines or the gate test line and the other terminal of the first connection layer connecting to the corresponding one of the data lines or one of the gate lines;

the second connection layer disposed under the first connection layer and a portion of the second connection layer overlapping with the first connection layer in location;

an insulating layer disposed between the first connection layer and the second connection layer; and a protection layer disposed above the first connection layer.

Wherein, a first region capable to be broken by laser is disposed at a portion of the first connection layer overlapping with the second connection layer; a second region capable to be connected with the second connection layer by laser welding is respectively disposed at both sides of the first region.

Wherein, one terminal of the first connection layer connects to the gate test line through ITO film, and the other terminal of the first connection layer connects to the corresponding one of the gate lines.

To solve the above technical problems, another embodiment of the present invention provides a TFT-LCD array substrate comprising:

a display area comprising a plurality of data lines and a plurality of gate lines;

a peripheral area located at a periphery of the display area and provided with a plurality of data test lines for transmitting a test signal for the data lines in the display area; and a gate test line for transmitting a test signal for the gate lines in the display area; and a connecting device comprising a first connection layer and a second connection and provided at a connection location between one of the data test lines in the first test short bar and one of the data lines in the display area, or/and provided at a connection location between the gate test line in the second test short bar and one of the gate lines in the display area.

Wherein, the connecting device comprises:

the first connection layer having two terminals, one terminal of the first connection layer connecting to one of the data test lines or the gate test line and the other terminal of the first connection layer connecting to the corresponding one of data lines or one of the gate lines;

the second connection layer disposed under the first connection layer and a portion of the second connection layer overlapping with the first connection layer in location;

an insulating layer disposed between the first connection layer and the second connection layer; and a protection layer disposed above the first connection layer.

Wherein, a first region capable to be broken by laser is disposed at a portion of the first connection layer overlapping with the second connection layer; a second region capable to be connected with the second connection layer by laser welding is respectively disposed at both sides of the first region.

Wherein, one terminal of the first connection layer connects to the gate test line through ITO film and the other terminal of the first connection layer connects to the corresponding one of the gate lines.

To solve the above technical problems, another embodiment of the present invention provides a test method for a TFT-LCD array substrate comprising:

executing a first test using a first test short bar and a second test short bar to transmit a test signal to a plurality of data lines and a plurality of gate lines in a display area through a first connection layer;

after completion of the first test, electrically disconnecting the first test short bar and the second test short bar from the data lines and the gate lines in the display area;

electrically reconnecting the first test short bar and the second test short bar with the data lines and gate lines in the display area through a second connection layer; and executing a second test using the first test short bar and the second test short bar electrically reconnected to respectively transmit a test signal to the data lines and gate lines in the display area.

Wherein, the step of electrically disconnecting the first test short bar and the second test short bar from the data lines and the gate lines in the display area is using laser to break a first region of the first connection layer so as to electrically disconnect the first test short bar and the second test short bar from the data lines and the gate lines in the display area.

Wherein, the step of electrically reconnecting the first test short bar and the second test short bar with the data lines and the gate lines in the display area through a second connection layer is using laser welding to electrically connect both sides of the first region of the first connection layer with the second connection layer under the first connection layer so as to electrically connect the first test short bar and the second test short bar with the data lines and the gate lines in the display area.

Wherein, further comprises a step of after completion of the second test, electrically disconnecting the first test short bar and the second test short bar from the data lines and the gate lines in the display area by laser.

Wherein, an insulating layer is disposed between the first connection layer and the second connection layer, and the second connection layer is overlapping with the first region and the second region of the first connection layer.

The beneficial effects of the present invention: through providing with the connecting device at the connection location between the test lines and the data lines or between the test lines and the gate lines in the display area. The connecting device comprises a first test layer and an alternate test layer insulated from each other in order to achieve testing the display area twice. Through the present invention, it can execute a second test for a TFT-LCD array substrate having problem in the subsequent process so as to quickly and simply determine the cause of the problem.

BRIEF DESCRIPTION OF THE DRAWINGS

In order to more clearly illustrate the technical solution in the present invention or in the prior art, the following will illustrate the figures used for describing the embodiments or the prior art. It is obvious that the following figures are only some embodiments of the present invention. For the skilled persons of ordinary skill in the art without creative effort, it can also obtain other figures according to these figures.

DETAILED DESCRIPTION OF THE PREFERRED EMBODIMENT

The following content combines the drawings for describing preferred embodiments of the present invention.

Figure 2:
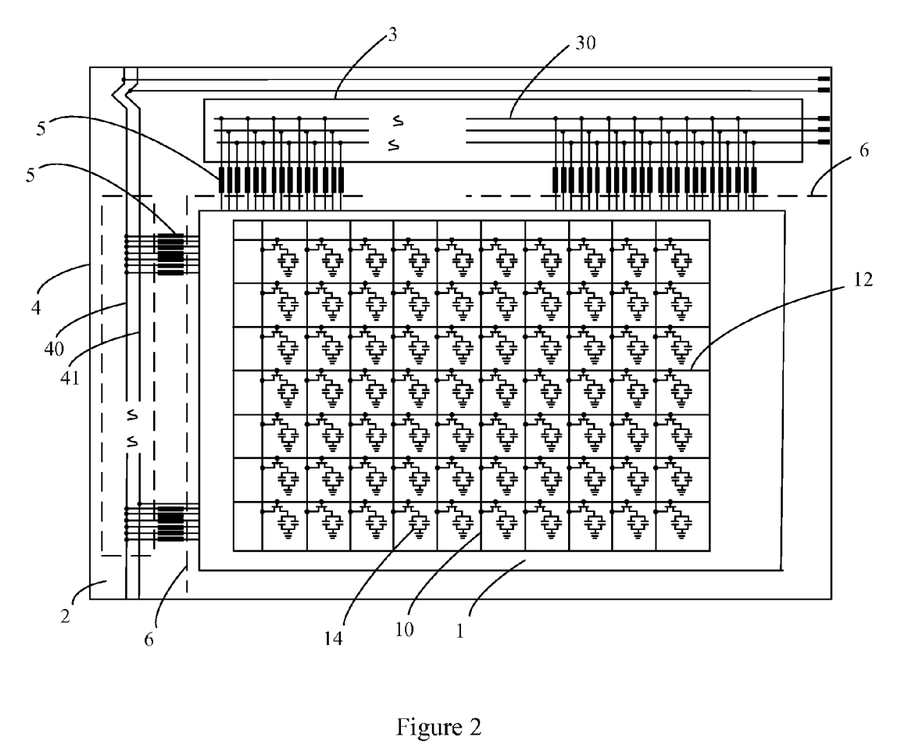
FIG. 2 is a schematic view of an embodiment illustrating a TFT-LCD array substrate of the present invention.

As shown in FIG. 2, it is a schematic view of an embodiment illustrating a TFT-LCD array substrate of the present invention. Wherein the TFT-LCD array substrate comprises: a display area 1 and peripheral area 2 located at the periphery of the display area 1.

In the display area 1, it disposed a plurality of data lines 10 and a plurality of gate lines 12 mutually perpendicular to each other and the intersection location of each of the data lines 10 and the gate lines 12 connect with a TFT unit 14. Each of the TFT units 14 includes a TFT, a liquid crystal capacitor, and a storage capacitor. The source electrode of the TFT of each of the TFT units 14 connects to one of the data line 10, and its gate electrode connects to one of the gate lines 12.

The peripheral area 2 provides with a first test short bar 3, and a plurality of data test lines 30 (respectively corresponding to a red, a green and a blue R/G/B signal terminal for testing) dispose on the first test short bar 3 for respectively transmitting a data test signal to the data lines 10 in the display area 1; a second test short bar 4 provides with gate test line 40 and a common electrode lines 41, wherein the gate test line 40 are used to transmit a gate test signal to the gate lines 12. The common electrode line 41 provides a common electrode for the TFT units 14.

Wherein, at a connection location of one of the data test lines 30 of the first test short bar 3 and on of the data line 10 of the display area 1, or at a connection location of the gate test line 40 and one of the gate line 12 of the second test short bar 4, it disposes a connecting device 5 having a first connection layer and a second connection layer. Through the connecting device 5, it could execute a second test to the display area 1.

Figure 3:
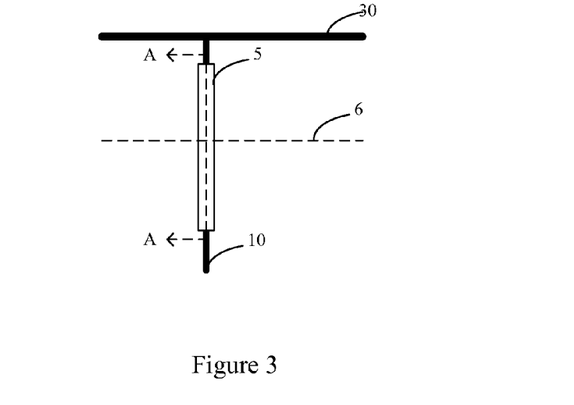
FIG. 3 is a schematic view illustrating one data test line connects to one data line in FIG. 2.
Figure 4:
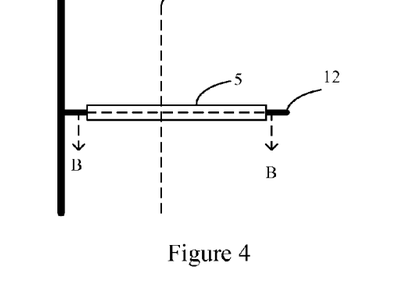
FIG. 4 is a schematic view illustrating one gate test line connects to one gate line in FIG. 2.

With further reference to FIG. 3 and FIG. 4, wherein FIG. 3 is a schematic view illustrating one data test line 30 connects to one data line 10 in FIG. 2, and FIG. 4 is a schematic view illustrating one gate test line 40 connects to one gate line 12 in FIG. 2.

As shown in the FIGS, the connecting device 5 is disposed at the connection location of one of the data test lines 30 and one of the data lines 10, and a connection location of the gate test line 40 and one of the gate lines 12.

In a specific embodiment, the connecting device 5 could be provided at the connection location of each of the data test lines 30 and the corresponding data lines 10. Similarly, the connecting device 5 could also be provided at the connection location of the gate line 40 and the corresponding gate lines 12.

Figure 5:
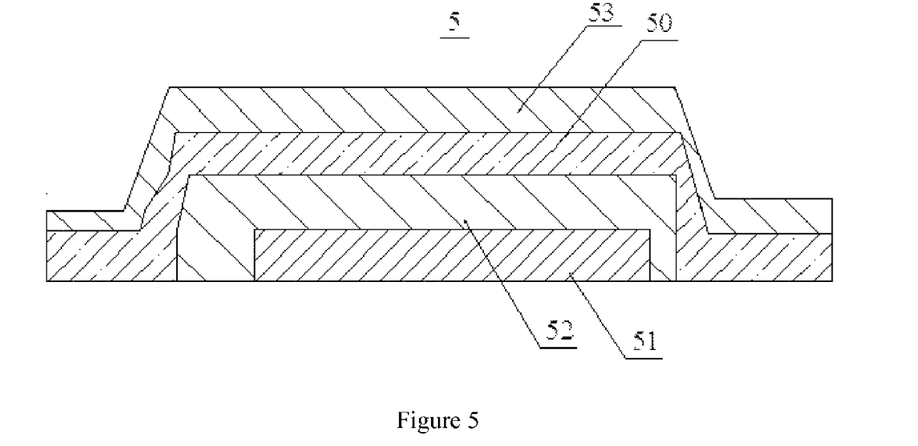
FIG. 5 is a schematic sectional view of A-A section in FIG. 3.

As shown in FIG. 5, it is a schematic sectional view of the line A-A in FIG. 3. The connecting device 5 comprises: a first connection layer 50 having two terminals, and one terminal is connected to one of the data test lines 30 and the other terminal is connected to the corresponding one of the data lines 12; a second connection layer 51 disposed below the first connection layer 50, and a portion of the second connection layer 51 is overlapping with the first connection layer 50 in location; an insulating layer 52 disposed between the first connection layer 50 and the second connection layer 51; a protection layer 53 disposed above the first connection layer 50.

Wherein, the first connection layer 50 is used for executing a first test for the display area 1. In this structure, the first connection layer 50 is a conductor layer. The data test lines 30 electrically connect to the corresponding data lines 12 through the first connection layer 50 so that the data test lines 30 could transmit test signals to the data lines 12.

The second connection layer 51 is also a conductor layer, and the insulating layer 52 is disposed between the first connection layer 50 and the second connection layer 52. At a first test, the second connection layer 51 is insulated from the data test lines 30 and the data lines 12 connected by the first connection layer 50. When it is required to execute a second test, it requires a method such as a laser welding to form an electrical connection between the data test lines 30 and the data lines 12.

Figure 7:
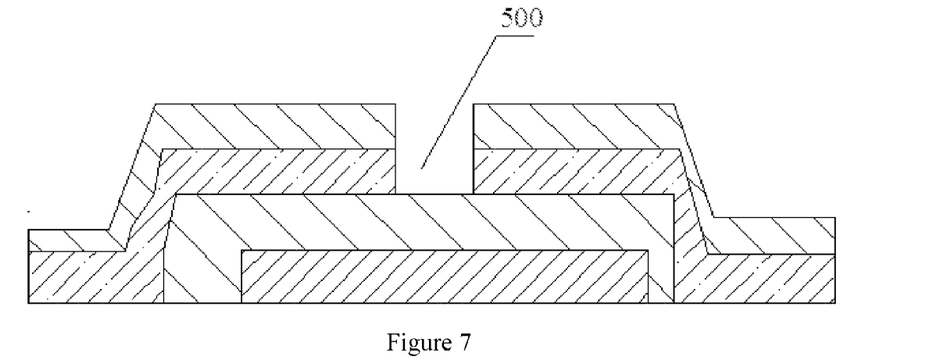
FIG. 7 is a schematic state view illustrating a broken first connection layer in FIG. 5.
Figure 9:
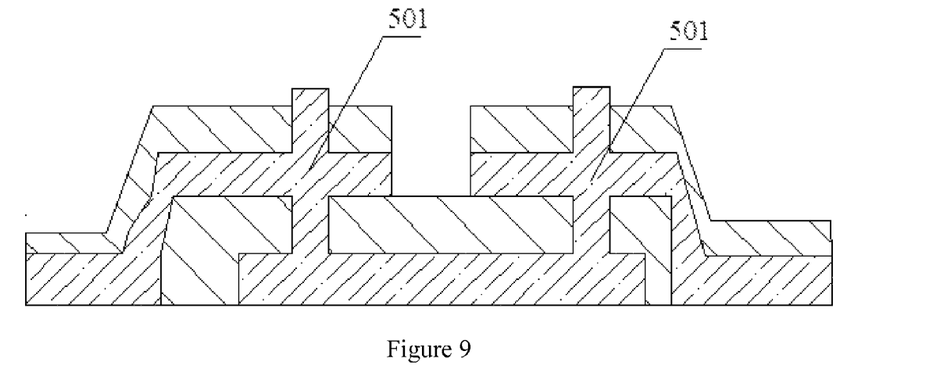
FIG. 9 is a schematic state view illustrating a first connection layer electrically connecting with a second connection layer in FIG. 7.

Please further refer to FIG. 7 and FIG. 9. Wherein FIG. 7 is a schematic state view illustrating a broken first connection layer in FIG. 5 and FIG. 9 is a schematic state view illustrating a first connection layer electrically connecting with a second connection layer in FIG. 7.

In the present invention, at the central location of the first connection layer 50 and a portion of the first connection layer 50 overlapping with the second connection layer 51, it provides with a first region 500 broken by laser; at both sides of the first region 500, it respectively provides with a second region 501 capable to be connected with the second connection layer 51 by laser welding.

As shown in FIG. 7 and at the first region 500, by controlling the energy of the laser, it can precisely break the protection layer 53 and the first connection layer 50 in order to electrically disconnect the data test lines 30 from the corresponding data lines 12.

As shown in FIG. 9 and in the second region 501, by controlling the energy of the laser, it can electrically connect the first connector layer 50 with the second connection layer 51 in order to form the electric connection between the data test lines 30, a portion of the first connection layer 50, the second connection layer 51, another portion of the first connector layer 50, and the data lines 12.

Figure 11:
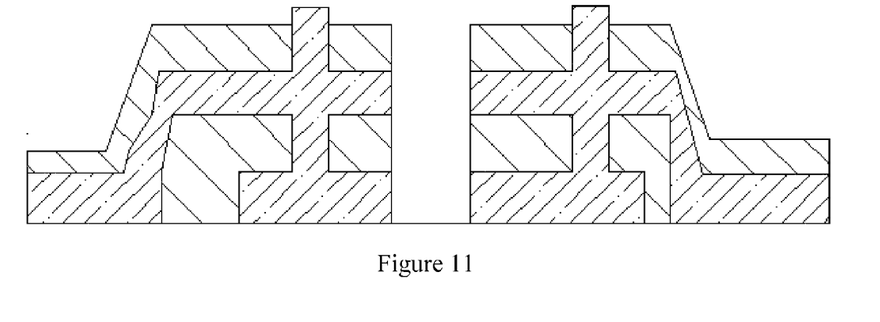
FIG. 11 is a schematic state view illustrating a broken second connection layer in FIG. 9.

As shown in FIG. 11, it is a schematic state view illustrating a broken second connection layer in FIG. 9. By controlling the laser energy, it can further break the insulating layer 52 and the second connection layer 51 at the first region 500 in order to break the electrical connection between the data test lines 30 and the corresponding data lines 12. It can be understood that in another embodiment, it can select other locations to break the protection layer 53, the first connection layer 50, the insulating layer 52, and the second connection layer 51 simultaneously by using the laser.

Figure 6:
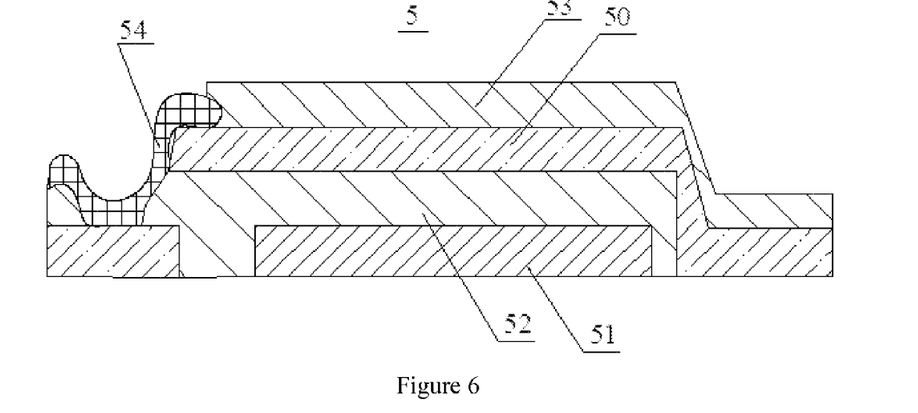
FIG. 6 is a schematic sectional view of B-B section in FIG. 4.

Please further refer to FIG. 6; it is a schematic sectional view of B-B in FIG. 4. The structure is substantially similar to FIG. 5. The connecting device 5 comprises: a first connection layer 50, one terminal of the first connection layer 50 electrically connects to the gate test line 40 by an indium tin oxide (ITO) film 54, and the other terminal of the first connection layer 50 electrically connects to the corresponding one of the gate lines 10; a second connection layer 51 is disposed below the first connection layer 50, and a portion of the second connection layer 51 is overlapping with the first connection layer 50;

An insulating layer 52 is provided between the first connector layer 50 and the second connection layer 51. A protection layer 53 is disposed above the first connection layer 50.

Figure 8:
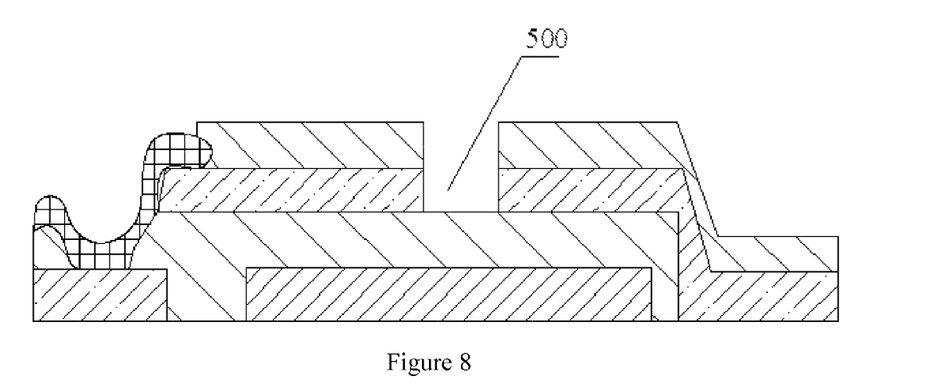
FIG. 8 is a schematic state view illustrating a broken first connection layer in FIG. 6.
Figure 10:
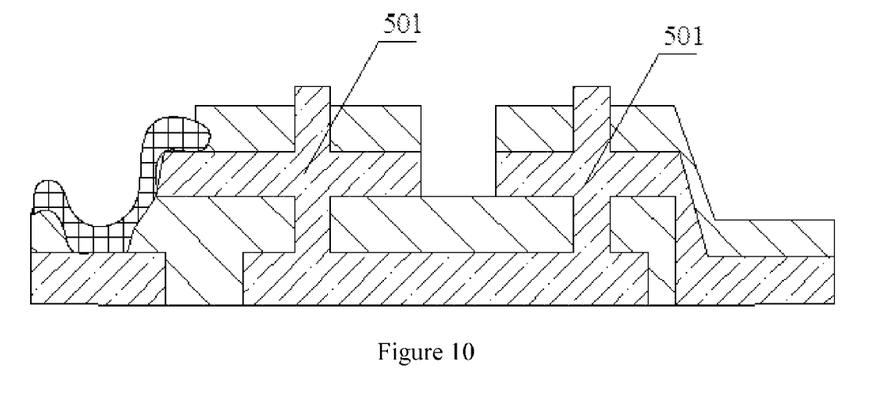
FIG. 10 is a schematic state view illustrating a first connection layer electrically connecting with a second connection layer in FIG. 8.
Figure 12:
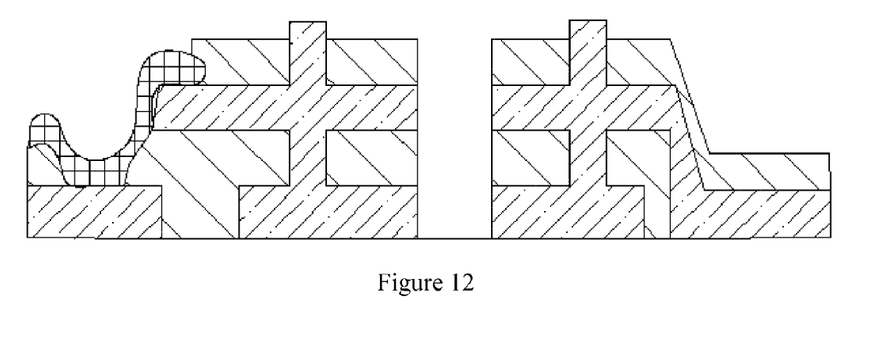
FIG. 12 is a schematic state view illustrating a broken second connection layer in FIG. 10.

Please further refer to FIG. 8, FIG. 10 and FIG. 12, wherein FIG. 8 is a schematic state view illustrating a broken first connection layer in FIG. 6; FIG. 10 is a schematic state view illustrating a first connection layer electrically connecting with a second connection layer in FIG. 8; FIG. 12 is a schematic state view illustrating a broken second connection layer in FIG. 10.

The structures and the operating principle shown in the three FIGS are respectively similar to FIG. 7, FIG. 9, and FIG. 11, which will not be described in detail again.

Correspondingly, the present invention provides a testing method for a TFT-LCD array substrate, which is used to execute the test described in the aforementioned FIGS. 1-6, and the method comprise:

Step one: executing a first test using a first test short bar and a second test short bar to transmit a test signal to a plurality of data lines and a plurality of gate lines in a display area through a first connection layer.

Step two: after completion of the first test, electrically disconnecting the first test short bar and the second test short bar from the data lines and the gate lines in the display area. Specifically: using laser to break a first region of the first connection layer so as to electrically disconnect the first test short bar and the second test short bar from the data lines and the gate lines in the display area. It is shown in FIG. 7 and FIG. 8.

Step three: electrically reconnecting the first test short bar and the second test short bar with the data lines and gate lines in the display area through a second connection layer. Specifically: using laser welding to electrically connect both sides of the first region of the first connection layer with the second connection layer under the first connection layer so as to electrically connect the first test short bar and the second test short bar with the data lines and the gate lines in the display area as shown in FIG. 9 and FIG. 10.

Step four: executing a second test using the first test short bar and the second test short bar electrically reconnected to respectively transmit a test signal to the data lines and gate lines in the display area.

Step five: after completion of the second test, electrically disconnecting the first test short bar and the second test short bar from the data lines and the gate lines in the display area by laser. As shown in FIG. 11 and FIG. 12, it further breaks the second connection layer at the first region. In other embodiments, it can also choose to break the protection layer, the first connection layer, the insulating layer, and the second connection layer at the same time at other location so as to achieve the effect of electrically disconnecting the first test short bar and the second test short from the display area.

Further, it is possible to separate the peripheral area and the display area at the position 6 such as cutting.

It can be understood that the above-described embodiments of the present invention are using test short bar for testing. In other embodiments without using test short bar, it can also use the technique of the present invention. It can also achieve the effect of the present invention by disposing the connecting device between the test lines and the data lines or between the test lines and the gate lines.

The present invention provides with the connecting device at the connection location between the test lines and the data lines or between the test lines and the gate lines in the display area. The connecting device comprises a first test layer and an alternate test layer insulated from each other in order to achieve testing the display area twice. Through the present invention, it can execute a second test for a TFT-LCD array substrate having problem in the subsequent process so as to quickly and simply determine the cause of the problem in order to prevent the TFT-LCD array substrate with problem from delivering to the customer.

The above content combines the preferred embodiments for detail description of the present invention. It is particularly pointed out that the above embodiments are only used to illustrate the present invention, and they are not used to limit the scope of the present invention. Other embodiments obtained under the premise of without paying creative labor by the person ordinary skill in the art are all belong to the claims of the present invention.

What is claimed is:

1. A TFT-LCD array substrate comprising:
a display area comprising a plurality of data lines and a plurality of gate lines;
a peripheral area located at a periphery of the display area and provided with
a first test short bar provided with a plurality of data test lines for transmitting a test signal for the data lines in the display area; and
a second test short bar provided with a gate test line for transmitting a test signal for the gate lines in the display area; and
a connecting device comprising a first connection layer and a second connection layer and provided at a connection location between one of the data test lines in the first test short bar and one of the data lines in the display area, or/ and provided at a connection location between the gate test line in the second test short bar and one of the gate lines in the display area; wherein, the connecting device comprises:
the first connection layer having two terminals, one terminal of the first connection layer connecting to one of the data test lines or the gate test line and the other terminal of the first connection layer connecting to the corresponding one of the data lines or one of the gate lines;
the second connection layer disposed under the first connection layer and a portion of the second connection layer overlapping with the first connection layer in location;
an insulating layer disposed between the first connection layer and the second connection layer; and
a protection layer disposed above the first connection layer.

2. The TFT-LCD array substrate according to claim 1, wherein, a first region capable to be broken by laser is disposed at a portion of the first connection layer overlapping with the second connection layer; a second region capable to be connected with the second connection layer by laser welding is respectively disposed at both sides of the first region.

3. The TFT-LCD array substrate according to claim 1, wherein, one terminal of the first connection layer connects to the gate test line through ITO film and the other terminal of the first connection layer connects to the corresponding one of the gate lines.

4. A test method for a TFT-LCD array substrate comprising:
executing a first test using a first test short bar and a second test short bar to transmit a test signal to a plurality of data lines and a plurality of gate lines in a display area through a first connection layer;
after completion of the first test, electrically disconnecting the first test short bar and the second test short bar from the data lines and the gate lines in the display area;
electrically reconnecting the first test short bar and the second test short bar with the data lines and gate lines in the display area through a second connection layer; and
executing a second test using the first test short bar and the second test short bar electrically reconnected to respectively transmit a test signal to the data lines and gate lines in the display area.

5. The test method for a TFT-LCD array substrate according to claim 4, wherein, the step of electrically disconnecting the first test short bar and the second test short bar from the data lines and the gate lines in the display area is specifically using laser to break a first region of the first connection layer so as to electrically disconnect the first test short bar and the second test short bar from the data lines and the gate lines in the display area.

6. The test method for a TFT-LCD array substrate according to claim 5, wherein, the step of electrically reconnecting the first test short bar and the second test short bar with the data lines and the gate lines in the display area through a second connection layer is using laser welding to electrically connect both sides of the first region of the first connection layer with the second connection layer under the first connection layer so as to electrically connect the first test short bar and the second test short bar with the data lines and the gate lines in the display area.

7. The test method for a TFT-LCD array substrate according to claim 6, wherein, further comprises a step of after completion of the second test, electrically disconnecting the first test short bar and the second test short bar from the data lines and the gate lines in the display area by laser.

8. The test method for a TFT-LCD array substrate according to claim 7, wherein, an insulating layer is disposed between the first connection layer and the second connection layer, and the second connection layer is overlapping with the first region and the second region of the first connection layer.

\* \* \* \* \*